United States Patent
Andre et al.

(10) Patent No.: US 10,048,592 B2
(45) Date of Patent: Aug. 14, 2018

(54) PROJECTION LENS, PROJECTION EXPOSURE APPARATUS AND PROJECTION EXPOSURE METHOD FOR EUV MICROLITHOGRAPHY

(71) Applicant: Carl Zeiss SMT GmbH, Oberkochen (DE)

(72) Inventors: Stephan Andre, Schwaebisch Gmuend (DE); Daniel Golde, Oberkochen (DE); Toralf Gruner, Aalen-Hofen (DE); Johannes Ruoff, Aalen (DE); Norbert Wabra, Werneck (DE); Ricarda Schoemer, Zusmarshausen (DE); Sonja Schneider, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 15/441,441

(22) Filed: Feb. 24, 2017

(65) Prior Publication Data

US 2017/0168399 A1    Jun. 15, 2017

Related U.S. Application Data

(63) Continuation of application No. PCT/EP2015/070391, filed on Sep. 7, 2015.

(30) Foreign Application Priority Data

Sep. 15, 2014  (DE) .......................... 10 2014 218 474

(51) Int. Cl.
*G03B 27/54*  (2006.01)
*G03F 7/20*  (2006.01)

(52) U.S. Cl.
CPC ........ *G03F 7/70266* (2013.01); *G03F 7/7015* (2013.01)

(58) Field of Classification Search
CPC . G03F 7/70308; G03F 7/70266; G03F 7/7015
(Continued)

(56) References Cited

U.S. PATENT DOCUMENTS 6,770,894 B1   8/2004   Schultz
6,853,440 B1   2/2005   Van De Pasch et al.
(Continued)

FOREIGN PATENT DOCUMENTS

CN        1573556 A     2/2005
CN      100487577 C     5/2009
(Continued)

OTHER PUBLICATIONS

German Office Action, with translation thereof, for corresponding DE Appl No. 10 2014 218 474.6, dated May 19, 2016.
(Continued)

*Primary Examiner* — Hung Henry Nguyen
(74) *Attorney, Agent, or Firm* — Fish & Richardson P.C.

(57) ABSTRACT

A projection lens is disclosed for imaging a pattern arranged in an object plane of the projection lens into an image plane of the projection lens via electromagnetic radiation having an operating wavelength λ from the extreme ultraviolet range. The projection lens includes a multiplicity of mirrors having mirror surfaces arranged in a projection beam path between the object plane and the image plane so that a pattern of a mask in the object plane is imagable into the image plane via the mirrors. A first imaging scale in a first direction running parallel to a scan direction is smaller in terms of absolute value than a second imaging scale in a second direction perpendicular to the first direction. The projection lens also includes a dynamic wavefront manipulation system for correcting astigmatic wavefront aberration portions caused by reticle displacement.

22 Claims, 4 Drawing Sheets

(58) Field of Classification Search
USPC .......................................... 355/52, 53, 55, 67
See application file for complete search history.

(56) References Cited

U.S. PATENT DOCUMENTS

| | | |
|---|---|---|
| 7,372,539 B2 | 5/2008 | Kirchner et al. |
| 2007/0058269 A1 | 3/2007 | Mann et al. |
| 2008/0239503 A1* | 10/2008 | Conradi .................. G02B 3/14 |
| | | 359/666 |
| 2010/0231883 A1* | 9/2010 | Dodoc ................ G03F 7/70308 |
| | | 355/67 |
| 2013/0128251 A1* | 5/2013 | Mann ..................... G02B 13/08 |
| | | 355/67 |

FOREIGN PATENT DOCUMENTS

| | | |
|---|---|---|
| DE | 10 2004 014 7 | 10/2004 |
| EP | 0 987 601 A2 | 3/2000 |
| EP | 1 039 510 A1 | 9/2000 |
| EP | 1 465 018 A2 | 10/2004 |
| WO | WO 2012/034995 A2 | 3/2010 |
| WO | WO 2011/120821 A1 | 10/2011 |
| WO | WO 2012/041459 A2 | 4/2012 |

OTHER PUBLICATIONS

International Search Report and Written Opinion for corresponding PCT Appl No. PCT/EP2015/070391, dated Jan. 25, 2016.
Chinese Office Action and Search Report, with translation thereof, for corresponding CN Appl No. 201580049768.0, dated Feb. 2, 2018.

* cited by examiner

PROJECTION LENS, PROJECTION EXPOSURE APPARATUS AND PROJECTION EXPOSURE METHOD FOR EUV MICROLITHOGRAPHY

CROSS-REFERENCE TO RELATED APPLICATIONS

The present application is a continuation of, and claims benefit under 35 USC 120 to, international application PCT/EP2015/070391, filed Sep. 7, 2015, which claims benefit under 35 USC 119 of German Application No. 10 2014 218 474.6, filed Sep. 15, 2014. The entire disclosure of international application PCT/EP2015/070391 and German Application No. 10 2014 218 474.6 are incorporated by reference herein.

FIELD

The disclosure relates to a projection lens for imaging a pattern arranged in an object plane of the projection lens onto an image plane of the projection lens via electromagnetic radiation having an operating wavelength λ from the extreme ultraviolet range (EUV). Furthermore, the disclosure relates to a projection exposure apparatus including such a projection lens and to a projection exposure method which can be carried out with the aid of the projection lens and the projection exposure apparatus.

BACKGROUND

Microlithographic projection exposure methods are predominantly used nowadays for producing semiconductor components and other finely structured components, e.g. masks for microlithography. These methods involve the use of a mask (reticle) that bears the pattern of a structure to be imaged, e.g. a line pattern of a layer of a semiconductor component. The pattern is positioned in a projection exposure apparatus between an illumination system and a projection lens in the region of the object plane of the projection lens and is illuminated with an illumination radiation provided by the illumination system. The radiation changed by the pattern passes as projection radiation through the projection lens, which images the pattern onto the substrate which is to be exposed and is coated with a radiation-sensitive layer and whose surface lies in the image plane of the projection lens, the image plane being optically conjugate with respect to the object plane.

In order to be able to produce ever finer structures, in recent years optical systems have been developed which operate with moderate numerical apertures and obtain high resolution capabilities substantially via the short wavelength of the electromagnetic radiation used from the extreme ultraviolet range (EUV), in particular with operating wavelengths in the range of between 5 nm and 30 nm. In the case of EUV lithography with operating wavelengths around 13.5 nm, for example given image-side numerical apertures of NA=0.3, theoretically a resolution of the order of magnitude of 0.03 μm can be achieved with typical depths of focus of the order of magnitude of approximately 0.15 μm.

Radiation from the extreme ultraviolet range cannot be focused or guided with the aid of refractive optical elements, since the short wavelengths are absorbed by the known optical materials that are transparent at higher wavelengths. Therefore, mirror systems are used for EUV lithography.

In the field of EUV microlithography, too, endeavours are made to further increase the resolution capability of the systems used by developing projection systems having an ever higher image-side numerical aperture NA, in order to be able to produce ever finer structures. For a given imaging scale β, the object-side numerical aperture $NA_O$ thus increases as well.

For higher-aperture EUV systems, narrowband masks pose a challenge because their reflectivity capability decreases greatly at larger angles of incidence of the radiation. Therefore, it has already been proposed to use greater reductions instead of the customary reducing imaging scale of 1:4 ($|β|=0.25$) for lithographic-optical systems. By way of example, an imaging scale of 1:8 ($|β|=0.125$) instead of 1:4 ($|β|=0.25$) halves the object-side numerical aperture $NA_O$ and thus also the angles of incidence of the illumination radiation at the mask by half. However, this imaging scale (for the same mask size) reduces the size of the exposed field and thus the throughput.

It has also already been recognized that when the object-side numerical aperture is increased, the object-side principal ray angle is increased, which can lead to shading effects by the absorber structure of the mask and to problems with the layer transmission. In particular, severe apodization effects can occur owing to the reticle coating, as discussed, for example, in WO 2011/120821 A1.

WO 2012/034995 A2 proposes for this reason, inter alia, designing an EUV projection lens as anamorphic projection lens. An anamorphic projection lens is characterized in that a first imaging scale in a first direction deviates from a second imaging scale in a second direction perpendicular to the first direction. The deviation lies significantly outside deviations possibly caused by manufacturing tolerances.

An anamorphic projection lens enables e.g. a complete illumination of an image plane with a large object-side numerical aperture in the first direction, without the extent of the reticle to be imaged in the first direction having to be increased and without the throughput of the projection exposure apparatus being reduced. Furthermore, in comparison with systems having a uniform imaging scale in both directions, a reduction of the losses of imaging quality that are caused by the oblique incidence of the illumination light can also be obtained.

If a 1:8 imaging scale ($|β|=0.125$) is set e.g. in the scan direction, where the field extent is small, while the customary 1:4 imaging scale ($|β|=0.25$) acts perpendicularly to the scan direction (cross-scan direction), then this does not introduce particularly large angles at the mask, but ensures that the field size compared with conventional non-anamorphic projection lenses with $|β|=0.25$ in both directions is only halved and not quartered. Moreover, the option arises of achieving full field again with larger reticles.

A projection exposure apparatus generally includes a manipulation system having a multiplicity of manipulators that make it possible to change the imaging properties of the system in a defined manner on the basis of control signals of a control unit. In this case, the term "manipulator" denotes, inter alia, optomechanical devices designed for actively influencing individual optical elements or groups of optical elements on the basis of corresponding control signals, in order to change the optical effect of the elements or groups in the projection beam path. Often, manipulators are also provided in order for example to displace, to tilt and/or to deform the mask and/or the substrate. Generally, manipulators are set in such a way that metrologically detected imaging aberrations can be reduced in a targeted manner.

In some EUV systems, a displacement of the reticle with components perpendicular to the object plane and/or a tilting constitute(s) an effective manipulation possibility in order to correct imaging aberrations. With oblique incidence of radiation in the reflective reticle and/or in non-telecentric systems, it is also possible to correct a lateral offset of structures via such reticle displacements. In this case, the active principle is based on the fact that, with non-telecentric illumination, a z-defocusing of the reticle alongside a corresponding z-defocusing of the image always additionally results in a lateral shift of the image. If the telecentricity of the illumination within the object field varies e.g. quadratically, then there is also a quadratic variation of the lateral image shift in the case of z-decentration, which can be used e.g. to correct quadratic distortion profiles present on the reticle or the substrate.

DE 10 2004 014 766 A1 (cf. U.S. Pat. No. 7,372,539 B2) proposes, for the purpose of correcting anamorphism in a projection lens of an EUV projection exposure apparatus, tilting the reticle by a small angle about an axis that is perpendicular to the axis of the projection lens and perpendicular to the scan direction and in each case is situated through the center of the light field generated on the reticle or the wafer.

EP 1 039 510 A1 proposes adjusting and tilting the reticle in the direction of the optical axis in order to correct aberrations in the imaging scale and the position of the generated image.

SUMMARY

The disclosure seeks to provide measures which allow the advantages of the use of anamorphic projection lenses to be obtained without having to accept specific disadvantages to a comparable extent.

In one aspect, the disclosure provides a projection lens for imaging a pattern arranged in an object plane of the projection lens into an image plane of the projection lens by means of electromagnetic radiation having an operating wavelength from the EUV range. The projection lens includes a multiplicity of mirrors having mirror surfaces arranged in a projection beam path between the object plane and the image plane in such a way that a pattern of a mask that is arranged in the object plane is imagable into the image plane by means of the mirrors. A first imaging scale in a first direction running parallel to a scan direction is smaller in terms of absolute value than a second imaging scale in a second direction perpendicular to the first direction. The projection lens also includes a dynamic wavefront manipulation system configured to correct astigmatic wavefront aberration portions caused by reticle displacement in direction perpendicular to the object plane.

In another aspect, the disclosure provides a projection exposure apparatus for exposing a radiation-sensitive substrate with at least one image of a pattern of a mask. The apparatus includes: an illumination system for receiving primary radiation from a primary radiation source and for generating an illumination radiation directed onto the mask; a projection lens for generating an image of the pattern in the region of an image plane of the projection lens; a mask holding device for holding the mask between the illumination system and the projection lens in such a way that the pattern is arranged in the region of an object plane of the projection lens and is movable in a scan direction perpendicular to a reference axis of the projection lens; and a substrate holding device for holding the substrate in such a way that a radiation-sensitive surface of the substrate is arranged in the region of the image plane of the projection lens. The image plane is optically conjugate with respect to the object plane, and is movable synchronously with the mask perpendicular to the reference axis of the projection lens. The projection lens is designed as described in the preceding paragraph.

In a further aspect, the disclosure provides a projection exposure method for exposing a radiation-sensitive substrate with at least one image of a pattern of a mask. The method includes providing the mask between an illumination system and an anamorphic projection lens of a projection exposure apparatus in such a way that the pattern is arranged in the region of an object plane of the projection lens and is imagable into an image plane of the projection lens. The image plane is optically conjugate with respect to the object plane, by means of the projection lens. The method also includes illuminating an illumination region of the pattern with an illumination radiation provided by the illumination system, and moving the mask in a scan direction during a scan operation. The method further includes displacing the mask in a displacement direction perpendicular to the object plane, and correcting astigmatic wavefront aberration portions caused by the displacement of the mask via a dynamic wavefront manipulation system. In some embodiments, displacing the mask and correcting astigmatic wavefront aberration portions are performed during the scan operation.

In another aspect, the disclosure provides a projection exposure method for exposing a radiation-sensitive substrate with at least one image of a pattern of a mask. The method includes providing the mask between an illumination system and an anamorphic projection lens of a projection exposure apparatus in such a way that the pattern is arranged in the region of the object plane of the projection lens. The method also includes holding the substrate in such a way that a radiation-sensitive surface of the substrate is arranged in the region of an image plane of the projection lens. The image plane is optically conjugate with respect to the object plane. The method further includes illuminating an illumination region of the mask with an illumination radiation provided by the illumination system, and projecting a part of the pattern that lies in the illumination region onto an image field at the substrate with the aid of the projection lens. In addition, the method includes moving the mask in a scan direction during a scan operation, displacing the mask in a displacement direction perpendicular to the object plane during the scan operation, and astigmatically influencing the wavefront of the projection radiation passing from the object plane to the image plane by driving at least one manipulator having a manipulable mirror arranged in the projection beam path and an actuating device for reversibly changing the optical effect of the manipulable mirror.

The inventors have recognized that, in the case of anamorphic lenses, at least one special feature occurs which does not occur in conventional systems having the same imaging scale in the scan direction and perpendicular thereto. A type of wavefront aberration specific to anamorphic lenses was identified. In the case of systems according to the claimed disclosure, this type of aberration, i.e. this aberration specific to this type of system, is addressed by specifically adapted measures and can be at least partly corrected.

The inventors proceed from the observation, inter alia, that the so-called longitudinal scale (or depth scale) in typical imaging systems is given by the square of the imaging scale. The longitudinal scale indicates the extent to which, in the case of an object shift having a directional component perpendicular to the object plane in the image region, refocusing has to be carried out in order to obtain a focused imaging. In an anamorphic lens, the imaging scale varies by definition with the orientation (deviation between imaging scale in first direction and in second direction). The same happens with the longitudinal scale. As a result, however, in the case of an object shift perpendicular to the object plane, structures having an orientation in the scan direction are defocused differently from structures having an orientation perpendicular thereto. These different focal positions are nothing more than astigmatism, which can be described in the lowest order e.g. by the fringe Zernike No. 5 (Z5). For non-anamorphic lenses, it should be emphasized that this astigmatism contribution is exactly zero.

The claimed disclosure makes it possible, inter alia, to change or to extend a normally implemented correction scenario of a projection lens compared with non-anamorphic lenses, in order to take account of this newly occurring aberration.

The projection lens includes a wavefront manipulation system for dynamically influencing the wavefront of the projection radiation passing from the object plane to the image plane of the projection lens. The effect of the components of the wavefront manipulation system which are arranged in the projection beam path can be set variably depending on control signals of a control unit, whereby the wavefront of the projection radiation can be changed in a targeted manner.

In some embodiments the optical effect of the wavefront manipulation system can be changed significantly in a targeted manner on a relatively short timescale during a scan operation, i.e. with high dynamics. A scan operation is an operation characterized by a synchronous movement of mask and substrate in respective scanning directions, where the mask is scanned once in the scanning direction so that, between the beginning and the end of this scanning operation, the entire pattern of the mask is transferred once onto the substrate.

If, for example, in the course of a scan operation, the reticle or the mask is displaced with a movement component directed perpendicularly to the object plane (in the z-direction), in order to compensate for specific aberrations, for example, in the case of an anamorphic projection lens an astigmatic wavefront aberration portion would be generated which could not be compensated for, or could be compensated for only inadequately, with correction possibilities known heretofore. By contrast, the dynamic wavefront manipulation system is able to compensate completely or at least partly for the astigmatic wavefront aberration portions caused by reticle displacement in the z-direction during a scan operation. In some embodiments this correction is possible variably over the scan operation, that is to say on a short timescale for lithography conditions, the timescale being of the order of magnitude of less than one second for a scan operation in current systems. With the aid of a highly dynamical wavefront manipulation system, the imaging characteristic of the projection lens can be changed during a scan operation according to a predefinable time profile in order to generate the desired astigmatic wavefront correction between beginning and end of a single scan operation.

Some embodiments include changing the optical effect of the wavefront manipulation system in a time interval outside a scan operation, for example before a scan operation starts. Such changes may be useful, for example, when a projection system is initially adjusted, e.g after a new mask has been installed. The wavefront manipulation system need not be constructed to be highly dynamic in those cases because changes may be brought about slowly, i.e. on a longer timescale. However, a highly dynamical wavefront manipulation system can be used for this purpose as well.

In accordance with one embodiment, it is provided that the wavefront manipulation system has a (at least one) first manipulator, which has a displaceable mirror arranged in the projection beam path and a first actuating device for reversibly changing the position of the mirror in relation to a reference position. This provides a first type of manipulator that uses the rigid body degrees of freedom of at least one mirror for wavefront manipulation. The mirror is displaced as a whole (i.e. changed with regard to its location or position), without the surface shape of the mirror surface being changed as a result. The displacement can include an axial displacement (displacement parallel to a reference axis of the projection lens directed orthogonally to the object plane), a lateral displacement (displacement in a lateral direction perpendicular to the reference axis) or a tilting of the mirror. It is also possible for the displacement to include a rotation of a mirror about a rotation axis or to consist exclusively in a rotation.

Although one individual manipulator of the first type of manipulator can be sufficient, two or more first manipulators are provided in some embodiments. In particular, all the mirrors of the projection lens as manipulators of the first type of manipulator can be made movable in a controlled manner in terms of their rigid body degrees of freedom. If two or more first manipulators are present, it is possible in an improved way to compensate partly or completely for the undesired (parasitic) aberrations generated by a first manipulator during the rigid body movement thereof via a suitable rigid body movement of at least one other first manipulator, such that as the overall effect substantially the desired astigmatic wavefront correction remains, while the level of parasitic aberrations is low by comparison therewith.

The at least one first manipulator can be dynamically designed such that a displacement of the mirror is carried out in a time interval between the beginning and end of a scan operation running in one direction according to a controllable movement profile from a starting position via at least one intermediate position back to the starting position. These movements can be carried out within a very short timescale, for example in the range of one or a plurality of tenths of a second.

However, the manipulator need not necessarily move back into the starting position again during a scanning operation. It is also possible for two successive scan operations to be scanned in opposite directions. The situation may then be that a manipulator moves back into the starting position again only in the second scan operation (on the return path). There may also be cases in which a manipulator does not move back into the starting position at all.

In these cases, too, movements relevant to the change of the optical effect can be carried out within a very short timescale, for example in the range of one or a plurality of tenths of a second.

Wavefront manipulations by rapid rigid body movement of one, a plurality or all of the mirrors can be implementable only in a relatively complex fashion, under certain circumstances, depending on the type of projection lens. Therefore, it may be useful alternatively or additionally to provide other types of manipulator.

In some embodiments, the wavefront manipulation system has a (at least one) second manipulator, which has a deformable mirror arranged in the projection beam path and having a mirror surface and an actuating device for reversibly astigmatically changing the surface shape of the mirror surface in relation to a reference surface shape. For this purpose, the actuating device can have for example diametrically oppositely arranged pairs of actuators or actuator groups which act in four quadrants of the mirror surface and can be driven differently in pairs in order to bring about an astigmatic change in the surface shape.

An imaging projection lens suitable for lithography has at least one pupil surface between the object plane and the image plane, the at least one pupil surface being a Fourier-transformed surface with respect to the object plane and with respect to the image plane. A deformable mirror should be arranged optically in proximity to the pupil surface in order to be able to manifest a sufficiently strong astigmatic correction effect in the case of the realistically obtainable surface deformations.

For quantifying the position of an optical element or of an optical surface in the beam path, it is possible to use the subaperture ratio SAR, for example.

In accordance with one clear definition, the subaperture ratio SAR of an optical surface of an optical element in the projection beam path is defined as the quotient between the subaperture diameter DSA and the optically free diameter DCA according to SAR:=DSA/DCA. The subaperture diameter DSA is given by the maximum diameter of a partial surface of the optical element which is illuminated with rays of a beam emerging from a given field point. The optically free diameter DCA is the diameter of the smallest circle around a reference axis of the optical element, wherein the circle encloses that region of the surface of the optical element which is illuminated by all rays coming from the object field.

In a field plane (e.g. object plane or image plane), SAR=0 accordingly holds true. In a pupil surface, SAR=1 holds true. "Near-field" surfaces thus have a subaperture ratio which is close to 0, while "near-pupil" surfaces have a subaperture ratio which is close to 1.

Preferably, the mirror having the astigmatically deformable mirror surface is arranged such that at the mirror surface the subaperture ratio SAR is between 0.5 and 1, in particular in the range of between 0.7 and 1.

In order to achieve imaging-relevant changes during the scan operation, the first manipulator and/or the second manipulator are/is preferably dynamically designed such that an actuating movement relevant to the change of the optical effect of the mirror is generatable within a short time scale of less than one second, in particular in the range of one or a few (e.g. 2 or 3 or 4 or 5 or 6 or 7 or 8 or 9) tenths of a second. Fast manipulators are therefore involved, which are also used with the high dynamic characteristic, as desired, during the scanning operation.

Manipulators of the first type of manipulator (movement in rigid body degrees of freedom) and of the second type of manipulator (mirror surface deformation) can be provided alternatively at different embodiments. As desired, a combination of different types of manipulator in the same projection lens is also possible.

In view of the fact that the astigmatic wavefront aberration portions which are given special emphasis here and which occur as a result of the anamorphic design of the projection lens are dependent on the difference between the squares of the imaging scales in the mutually perpendicular directions, it is considered to be advantageous if a scale ratio between the (in terms of absolute value larger) imaging scale and the (in terms of absolute value smaller) imaging scale is not too large. The scale ratio can be e.g. in the range of 1.1 to 2.5, in particular in the range of 1.5 to 2. As a result, the extent of the astigmatic wavefront portions to be corrected can be limited to relatively small values, such that the aberration to be corrected is kept small. If the projection lens has e.g. an imaging scale $\beta_x$=0.25 in the x-direction and an imaging scale $\beta_y$=0.125 in the y-direction, this results in a scale ratio of 2.

Alternatively or additionally, for generating a quadratic field profile of the image deviation in the second direction (x-direction (Z2 aberration)) at the location of the reticle, i.e. in the object plane, it is possible to provide a relatively great variation of the telecentricity (telecentricity variation) in the second direction in order to reduce the travel of the reticle in the z-direction for the correction. If this travel becomes small, then the undesired astigmatic wavefront aberration portions caused thereby can also be kept small and corrected correspondingly more easily.

A telecentricity variation is defined by the front focal length and is all the greater, the smaller the front focal length. For infinite front focal length, the optical system is telecentric at the input and therefore has no variation. In some cases it is considered to be advantageous if the front focal length in the second direction is less than 3 m in terms of absolute value, wherein the front focal length is preferably less than 2 m, in particular less than 1 m. The front focal length in the second direction can correspond to the front focal length in the first direction, but this need not be the case. It can thus deviate from the front focal length in the first direction.

The projection lens can be designed to image a rectangular effective object field (rectangular field) into a rectangular effective image field. Alternatively, the projection lens can be designed for imaging a ring field that is curved in the scan direction, that is to say an arcuate effective object field. In this case, it is considered to be advantageous if a curvature of the ring field is dimensioned such that in the image plane a distance—measured in the scan direction—between a middle field point at a field edge lagging in the scan direction and marginal field points at the margin of the field edge corresponds to more than 5%, preferably more than 15%, in particular more than 25%, of the field width measured perpendicularly to the scan direction. Such a greatly curved ring field can be useful, for example, if a correction scenario is conducted in which a quadratic Z3 variation, that is to say a quadratic variation of the image deviation in the y-direction or scan direction, over the field is intended to be generated. Such corrections can be useful for example for compensating for wavefront aberrations in the event of reticle heating. In this situation, a more greatly curved ring field contributes to the fact that only a small tilting of the reticle for the correction. As a result, the associated astigmatism for the correction amplitude chosen also remains relatively small, and so the correction by the wavefront manipulation system can also turn out to be moderate.

A wavefront manipulation system which is able to compensate for astigmatic wavefront aberration portions of the type described can also be used as fast correction possibility for correcting an x-y-astigmatism independently of the correction of astigmatic wavefront aberration portions caused by reticle displacement. Such aberrations can specifically arise as a result of heating effects in systems which are used with dipole illumination, for example.

The disclosure also relates to a projection exposure apparatus including a projection lens of the type under consideration here, i.e. including a dynamic wavefront manipulation system for correcting astigmatic wavefront aberration portions caused by reticle displacement before and/or during a scan operation.

In some embodiments, the mask holding device of the projection exposure apparatus includes a z-shift device for the controlled displacement of the mask parallel to a z-direction moving orthogonally to the object plane. This z-shift device can be used in the context of various correction scenarios in order to displace the mask with a movement component parallel to the z-direction, whereby astigmatic wavefront aberration portions are generated in the anamorphic projection lens on account of the different imaging scales in mutually perpendicular directions. This can be compensated for with the aid of the wavefront manipulation system in the manner described. A tilting of the reticle about the x-axis and/or about the y-axis can likewise be possible and expedient. For this purpose, the mask holding device can contain a tilting device.

The disclosure also relates to a projection exposure method for exposing a radiation-sensitive substrate with at least one image of a pattern of a mask. An anamorphic projection lens can be used here.

In some embodiments, upon the movement of the mask in a scan direction during a scan operation, a controlled displacement of the mask in a displacement direction (z-direction) perpendicular to the object plane can occur at least in phases, e.g. in order to compensate for specific aberrations. With the aid of astigmatic influencing of the wavefront of the projection radiation passing from the object plane to the image plane by the driving of at least one manipulator which has a manipulable mirror arranged in the projection beam path and an actuating device for reversibly changing the optical effect of the manipulable mirror, astigmatic aberrations generated by the z-displacement can be partly or completely compensated for.

A driving of actuating devices of manipulators of the wavefront manipulation system can be carried out depending on a dynamic displacement and/or tilting of the mask in order to achieve a near-instantaneous correction effect during the scan operation. The driving can be carried out e.g. on the basis of a feedforward model using previously calculated sensitivities. It is also possible to carry out the driving on the basis of at least one previously calculated look-up table in which are stored e.g. corresponding actuating travels of actuating devices of the mirrors previously calculated for any relevant displacement movement of the mask. As a result, a quasi-instantaneous reaction of the wavefront manipulation system to changes in the position of the reticle is achievable even with moderate computing power of the control.

BRIEF DESCRIPTION OF THE DRAWINGS

Further advantages and aspects of the disclosure are evident from the claims and from the following description of preferred exemplary embodiments of the disclosure which are explained below with reference to the figures, in which:

DETAILED DESCRIPTION OF THE EXEMPLARY EMBODIMENTS

Figure 1:
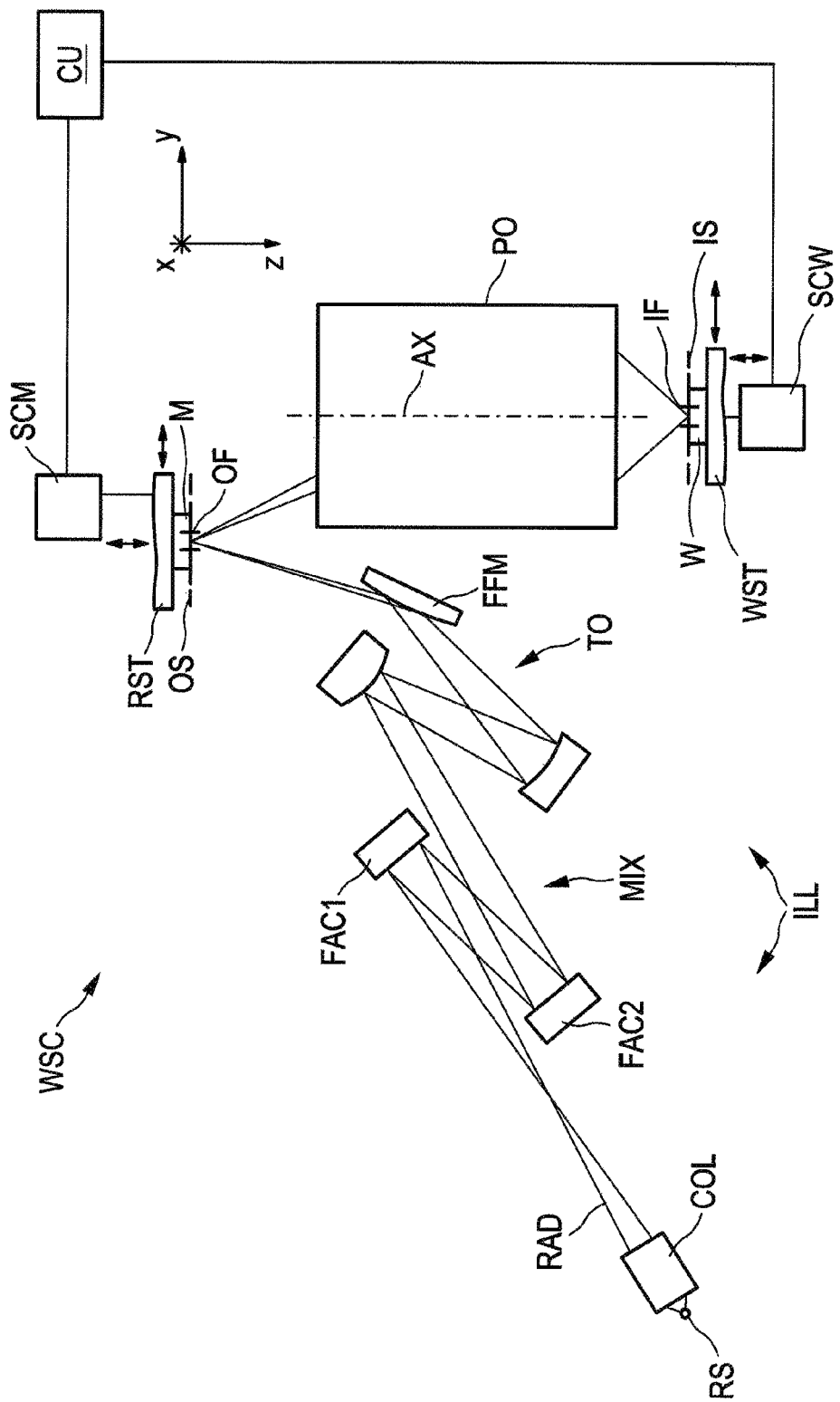
FIG. 1 schematically shows a section through a projection exposure apparatus for EUV microlithography.

FIG. 1 shows by way of example optical components of an EUV microlithography projection exposure apparatus WSC in accordance with one embodiment of the disclosure. The EUV microlithography projection exposure apparatus serves for exposing a radiation-sensitive substrate W, which is arranged in the region of an image plane IS of a projection lens O, with at least one image of a pattern of a reflective mask M, the pattern being arranged in the region of an object plane OS of the projection lens. The mask M is also designated here alternatively as reticle M. The substrate is a wafer composed of semiconductor material in the case of the example.

To facilitate understanding of the description, a Cartesian xyz-coordinate system is indicated, which reveals the respective positional relationship of the components illustrated in the figures. The projection exposure apparatus WSC is of the scanner type. The x-axis runs perpendicularly to the plane of the drawing into the latter in FIG. 1. The y-axis runs towards the right. The z-axis runs downwards. The object plane OS and the image plane IS both run parallel to the x-y-plane. During the operation of the projection exposure apparatus, the mask M and the substrate are moved synchronously or simultaneously during a scanning operation in the y-direction (scan direction) and thereby scanned.

The apparatus is operated with the radiation of a primary radiation source RS. An illumination system ILL serves for receiving the radiation of the primary radiation source and for shaping illumination radiation directed onto the pattern. The projection lens PO serves for imaging the pattern onto a light-sensitive substrate.

The primary radiation source RS can be, inter alia, a laser plasma source or a gas discharge source or a synchrotron-based radiation source. Such radiation sources generate radiation RAD in the EUV range, in particular having wavelengths of between 5 nm and 15 nm. The illumination system and the projection lens are constructed with components that are reflective to EUV radiation in order that they can operate in this wavelength range.

The radiation RAD emerging from the radiation source RS is collected via a collector COL and guided into the illumination system ILL. The illumination system includes a mixing unit MIX, a telescope optical unit TO and a field forming mirror FFM. The illumination system shapes the radiation and thus illuminates an illumination field situated in the object plane OS of the projection lens PO or in proximity thereto. In this case, the form and size of the illumination field determine the form and size of the effectively used object field OF in the object plane OS.

During the operation of the apparatus, the reflective reticle M is arranged in the region of the object plane OS.

The mixing unit MIX substantially consists of two facet mirrors FAC1, FAC2. The first facet mirror FAC1 is arranged in a plane of the illumination system that is optically conjugate with respect to the object plane OS. It is therefore also designated as a field facet mirror. The second facet mirror FAC2 is arranged in a pupil plane of the illumination system that is optically conjugate with respect to a pupil plane of the projection lens. It is therefore also designated as a pupil facet mirror.

With the aid of the pupil facet mirror FAC2 and the imaging optical assembly disposed downstream in the beam path and including the telescope optical unit TO and the field forming mirror FFM operated with grazing incidence, the individual mirroring facets (individual mirrors) of the first facet mirror FAC1 are imaged into the object field.

The spatial (local) illumination intensity distribution at the field facet mirror FAC1 determines the local illumination intensity distribution in the object field. The spatial (local)

illumination intensity distribution at the pupil facet mirror FAC2 determines the illumination angle intensity distribution in the object field OF.

Figure 2:
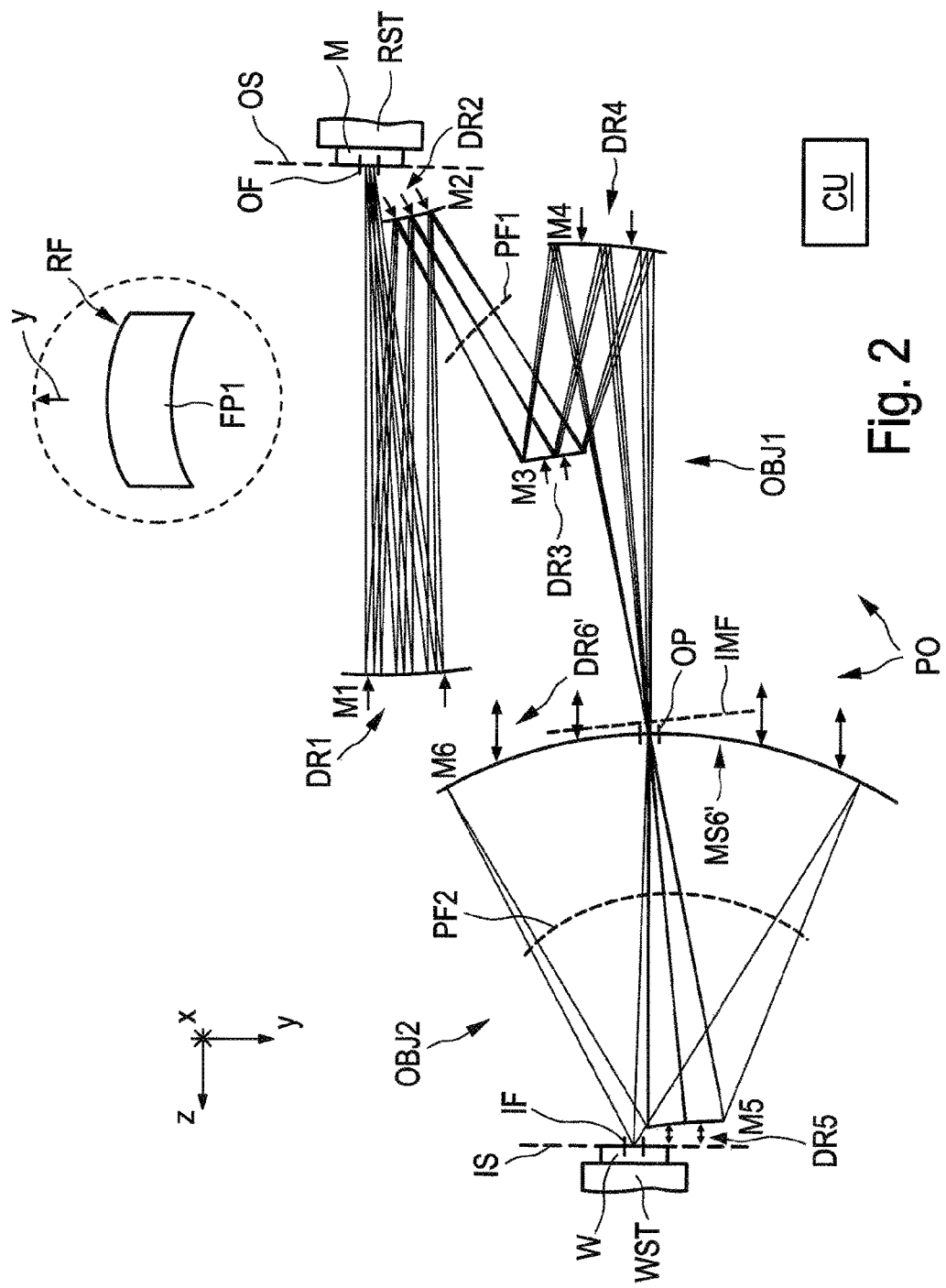
FIG. 2 schematically shows an excerpt from the projection exposure apparatus in accordance with FIG. 1 for elucidating the beam path in the projection lens in accordance with a first exemplary embodiment.
Figure 3:
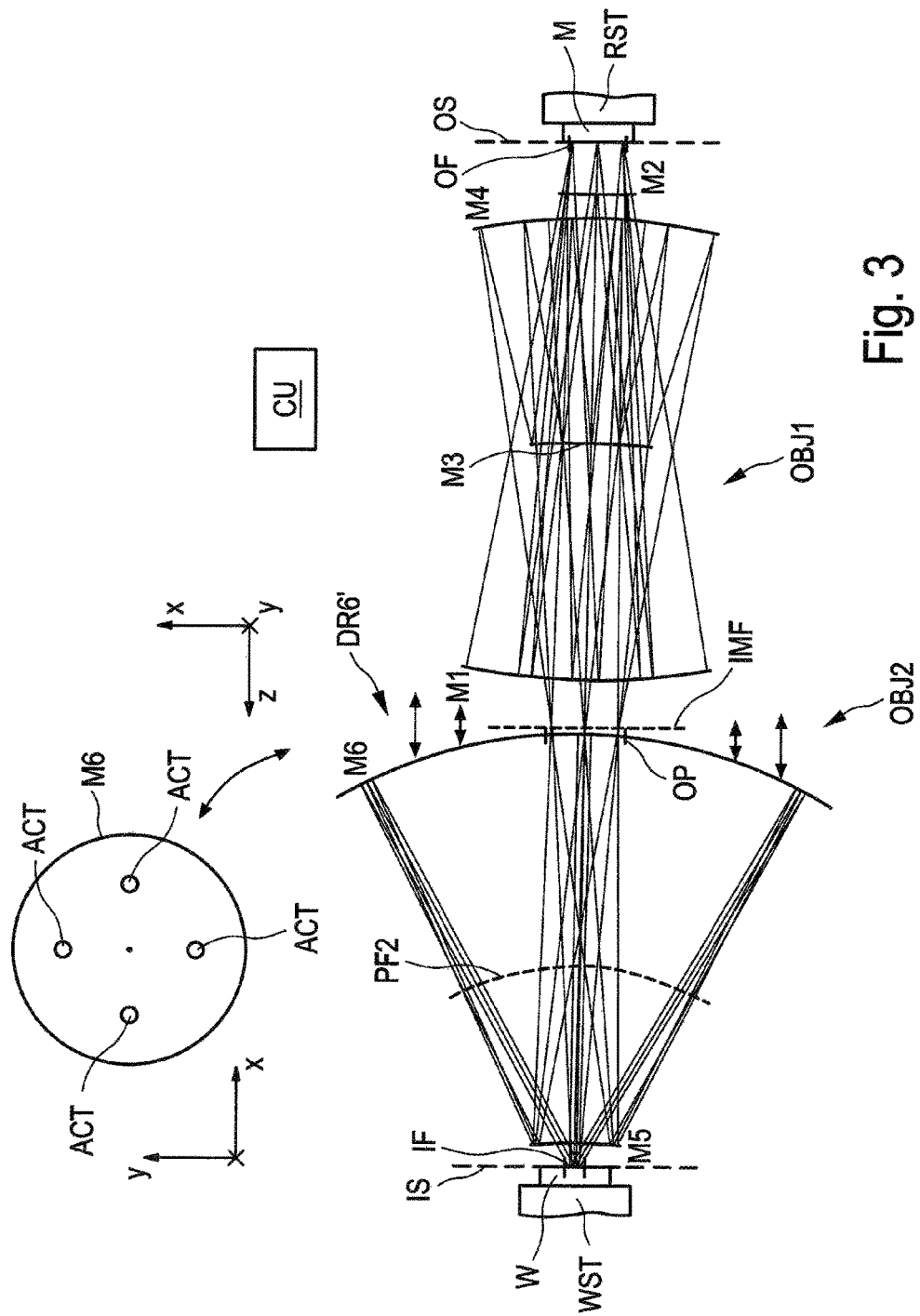
FIG. 3 shows an illustration corresponding to FIG. 2 in a plane perpendicular thereto.

The effective object field OF is a rectangular field in the exemplary embodiment in FIGS. 2 and 3, but in other variants can also be a curved field (ring field RF, see detail in FIG. 2).

A mask holding device RST for holding and manipulating the mask M (reticle) is arranged such that the pattern arranged on the mask lies in the object plane OS of the projection lens PO, the object plane here also being designated as the reticle plane. The mask is movable in this plane for scanner operation in a scan direction (y-direction) perpendicular to the reference axis AX of the projection lens (z-direction) with the aid of a scan drive SCM.

The mask holding device RST includes a z-displacement device for the controlled displacement of the reticle parallel to the z-direction (perpendicular to the scan direction and to the x-direction). It can furthermore contain a tilting device in order to tilt the mask as desired from the position parallel to the object plane about a tilting axis running parallel to the x-direction and/or about a tilting axis running parallel to the y-direction. These devices are dynamically usable during scanning, in particular in such a way that a displacement of the mask can be carried out in a time interval between beginning and end of a scan operation proceeding in one direction according to a predefinable movement profile.

The substrate W to be exposed is held by a substrate holding device WST including a scanner drive SCW in order to move the substrate synchronously with the mask M perpendicularly to the reference axis AX in a scan direction (y-direction). Depending on the design of the projection lens PO, these movements of mask and substrate can be carried out parallel or antiparallel to one another.

The substrate holding device WST includes a z-displacement device for the controlled displacement of the substrate parallel to the z-direction (perpendicular to the scan direction). It can furthermore contain a tilting device in order to tilt the wafer or the substrate as desired from the position parallel to the image plane about a tilting axis running parallel to the x-direction and/or about a tilting axis running parallel to the y-direction. These devices are dynamically usable during scanning, in particular in such a way that a displacement of the substrate can be carried out in a time interval between beginning and end of a scan operation proceeding in one direction according to a predefinable movement profile.

The substrate holding device WST, which is also designated as "wafer stage", and the mask holding device RST, which is also designated as "reticle stage", are part of a scanner device controlled via a scan control unit, which in the case of the embodiment is integrated into the central control unit CU of the projection exposure apparatus.

The illumination system ILL has an exit pupil, the shape of which is adapted to the shape of an entrance pupil of the projection lens PO and in particular corresponds precisely to the latter. The exit pupil of the illumination system ILL is embodied in an elliptic fashion. This can be achieved in particular via an elliptically embodied pupil facet mirror FAC2. As an alternative thereto, the pupil facets can also be arranged on the pupil facet mirror FAC2 in such a way that they have an elliptically embodied envelope.

The semiaxes of the elliptic pupil facet mirror FAC2 can have two different semiaxis lengths, wherein the larger semiaxis length is e.g. at least one and a half times, possibly even at least double, the magnitude of the first semiaxis length. The semiaxes of the exit pupil of the illumination system ILL can correspondingly likewise have different semiaxis lengths, preferably with the same semiaxis length ratios as the exit pupil of the illumination system.

For traditional rotationally symmetrical systems having a non-anamorphic imaging scale, the principal rays of the illumination beams should meet in the entrance pupil plane of the projection lens in order to ensure a field-constant optimum illumination. For VUV systems (systems which operate with operating wavelengths from the vacuum ultraviolet range), the entrance pupil is typically at infinity; therefore, these systems are telecentric, i.e. the principal rays impinge on the reticle perpendicularly. In the case of EUV systems, the reflective reticle has to be illuminated obliquely in order to separate the illumination beam path and the projection beam path. Therefore, the entrance pupil should be situated at a finite distance from the reticle. A distance in the range of 1 m to 3 m is considered to be advantageous here. This results in a variation of the principal ray angle at the reticle, to a first approximation a linear profile which corresponds to a linear telecentricity profile in the x-direction and which thus generates a linear Z2 upon a z-shift of the reticle.

The projection lens PO serves for the reducing imaging of the pattern arranged in the object plane OS of the projection lens into the image plane IS, which is optically conjugate with respect to the object plane and lies parallel thereto. This imaging is carried out via electromagnetic radiation from the extreme ultraviolet range (EUV) around an operating wavelength $\lambda$, which is 13.5 nm in the case of the example. The object field OF is imaged into an image field IF in this case.

An anamorphic projection lens is involved. The anamorphic projection lens is no longer rotationally symmetrical, but rather designed as a freeform surface design. Therefore, it is no longer absolutely necessary for there to be a single entrance pupil position, rather the x- and y-directions can be decoupled from one another and lie in different planes. This is then referred to as an astigmatic entrance pupil. Therefore, the illumination system can likewise be equipped with an astigmatic, i.e. non-homocentric imaging which is adapted to the astigmatic entrance pupil of the projection lens.

FIGS. 2 and 3 show in different views the optical design of a first embodiment of an anamorphic projection lens PO. The illustrations show the beam path of individual rays of the radiation which proceed from a central object field point and from two object field points respectively defining the two opposite margins of the object field OF.

The projection lens PO in accordance with FIG. 2 and FIG. 3 has a total of six mirrors, which are numbered consecutively by M1 (first mirror) to M6 (sixth mirror) in the direction of the beam path, proceeding from the object field OF. FIGS. 2 and 3 illustrate the reflection surfaces of the mirrors M1 to M6 as calculated during the design of the projection lens PO. As evident from the figures, in part only a segment of the surfaces illustrated is actually used for reflecting the radiation. The actual embodiment of the mirrors M1 to M6 can thus be smaller than is illustrated in the figures, in particular can include only a part of the calculated reflection surface illustrated in the figures.

A first pupil surface PF1, which can be plane or curved, is situated between the second mirror M2 and the third mirror M3. Moreover, an intermediate image surface IMF is situated between the fourth mirror M4 and the fifth mirror M5. The intermediate image surface IMF can be plane or curved. The mirrors M1 to M4 thus form a first (imaging) partial lens OBJ1. The mirrors M5 and M6 form a second imaging partial lens OBJ2.

The projection lens does not have a "traditional" optical axis common to all the mirrors. A reference axis AX (see FIG. 1) runs perpendicularly to the object plane and the image plane parallel thereto. The optical system has a mirror symmetry with respect to the y-z-plane illustrated in FIG. 3 (cf. FIG. 3).

The first partial lens OBJ1 is an anamorphic lens, i.e. it images anamorphically. The second partial lens OBJ2 is likewise an anamorphic lens, i.e. it images anamorphically. However, it is likewise possible for the second partial lens OBJ2 to be embodied as non-anamorphic.

An anamorphic system having freeform surfaces is involved. In the case of a mirror having a freeform surface, the mirror surface has different radii of curvature in the x- and y-directions, that is to say is astigmatic. The overall effect here is such that a system or subsystem images anamorphically. The projection lens PO can include a plurality of astigmatically imaging mirrors, e.g. two, three, four, five or six.

The projection lens PO thus has a first imaging scale $\beta_1$ in a first direction and a second imaging scale $\beta_2$, different therefrom, in a second direction. The second imaging scale can be e.g. at least one and a half times the magnitude of the first imaging scale, in particular at least double the magnitude thereof.

The projection lens PO is embodied in such a way that the absolute value of the imaging scale in the scan direction (y-direction) is less than the absolute value of the imaging scale perpendicular thereto. Therefore, the system has a more greatly reducing effect in the scan direction than in the cross-scan direction. The absolute value of the imaging scale in the scan direction can be e.g. at most three quarters, in particular at most two thirds, in particular at most half, the magnitude of that perpendicular thereto.

The projection lens PO has a direction-dependent object-side numerical aperture ($NA_O$), i.e. the entrance pupil deviates from the circular shape. In this case, the object-side numerical aperture ($NA_O$) in a specific direction, namely in the direction of the large imaging scale, is e.g. at least one and a half times the magnitude of that in the direction perpendicular thereto.

The sixth mirror M6 has a through opening OP for the passage of the radiation. A further pupil surface PF2 is situated between the mirrors M5 and M6. The pupil surface PF2 can be plane or curved.

The mirrors M1 to M6 are embodied as reflective to EUV radiation. They bear in particular multiple reflection layers for optimizing their reflection for the incident EUV illumination light (multilayer mirror). The reflection can be optimized all the better, the closer the angle of incidence of the individual rays on the mirror surfaces is to normal incidence.

The mirrors M1 to M5 have reflection surfaces embodied in a closed fashion, that is to say without a through opening. The mirrors M1, M4 and M6 have concave reflection surfaces. The mirrors M2, M3 and M5 have convex reflection surfaces.

The mirrors M1 to M6 of the projection lens PO or their reflection surfaces are embodied as freeform surfaces that are not describable by a rotationally symmetrical function. Such a freeform surface can be generated from a rotationally symmetrical reference surface. Freeform surfaces for reflection surfaces of the mirrors of projection lenses of projection exposure apparatuss for microlithography are known e.g. from US 2007-0058269 A1. A freeform surface can be described mathematically by the following equation:

$$Z(x, y) = \frac{cr^2}{1 + \sqrt{1 - (1+k)c^2 r^2}} + \sum_{j=2}^{N} \frac{C_j}{N_{radius}^{m+n}} x^m y^n$$

wherein it holds true that:

$$j = \frac{(m+n)^2 + m + 3n}{2} + 1$$

Z is the sagittal height of the freeform surface at the point x, y, where $x^2+y^2=r^2$. The parameter c is a constant corresponding to the vertex curvature of a corresponding asphere. k corresponds to a conic constant of a corresponding asphere. $C_j$ are the coefficients of the monomials $x^m$, $y^n$ The values of c, k and $C_j$ are typically determined on the basis of the desired optical properties of the mirror within the projection lens PO. $N^{m+n}_{radius}$ is a normalization factor for the coefficients $C_j$. The order of the monomial, m+n, can be varied arbitrarily. A higher-order monomial can lead to a design of the projection lens with better image aberration correction, but is more complex to calculate. m+n can assume values of between 3 and more than 20.

The tables indicated at the end of the description summarize optical design data of the projection lens PO in tabular form, which data were obtained with the aid of the optical design program Code V®. Table 1 specifies, with respect to the optical surfaces of the optical components and with respect to the aperture stop, in each case the reciprocal of the vertex curvature (Radius) and a distance value (Thickness) corresponding to the z-distance between adjacent elements in the beam path, proceeding from the image plane IS, that is to say counter to the light direction.

Table 2 specifies the coefficients $C_j$ of the monomials $x^{mn}$ in the above-specified freeform surface equation for the mirrors M1 to M6. Table 3 specifies the absolute value in nm along which the respective mirror, proceeding from a mirror reference design, was decentered (Y-decenter) and rotated (X-rotation). This corresponds to a parallel shift and a tilting in the case of the freeform surface design method. In this case, shifting is effected in the y-direction and tilting is effected about the x-axis. In this case, the angle of rotation is specified in degrees.

The second mirror M2 is curved to different extents in the X-direction and Y-direction. This is evident from the fact that the quadratic coefficients X2 and Y2 in table 1 have distinctly different orders of magnitude (difference approximately a factor of 20). That contributes to the fact that the first partial lens OBJ1 (and also the entire projection lens) images anamorphically.

This basic design of the projection lens corresponds to the projection lens in FIGS. 2 and 3 in WO 2012/034995 A2. Other projection lenses described in the application can likewise be used in the context of the present disclosure. The disclosure content of the document WO 2012/034995 A2 in its entirety is incorporated in the content of this description.

The projection exposure apparatus in the exemplary embodiment includes a manipulation system having numerous manipulators which make it possible to change the imaging properties of the projection lens and, if appropriate, the imaging-influencing properties of other components in a defined manner on the basis of control signals of the control unit CU. In this case, the term "manipulator" denotes a device which is designed for changing its optical effect in a targeted manner on the basis of corresponding control signals of a control. In general, manipulators are set in such a way that metrologically detected imaging aberrations can be reduced in a targeted manner.

During the operation of the projection exposure apparatus, e.g. the reticle stage and the substrate stage have to be moved in a manner highly accurately synchronized with one another. For this purpose, there are precise movement capabilities and dynamic control capabilities which make reticle and substrate stages excellent manipulators. Aberrations can be corrected by targeted deviations from the exactly synchronized profile. By way of example, if the ratio of the movement speeds of reticle and substrate deviates from the design scale, then scale errors such as may have occurred during mask production or arise as a result of element heating, for instance, can be compensated for. This correction is possible variably over the scan process, that is to say on a very short timescale for lithography conditions of tenths of a second.

Especially in combination with ring fields and the oblique incidence of light on the EUV reticle for the purpose of disentangling illumination and projection lens, tilts of reticle stage and/or substrate stage can set quadratic field profiles of Z2, Z3 and Z4. The abbreviations Z2, Z3 etc. here stand generally for Zernike coefficients that describe specific aberrations relevant to the imaging. In this case, Z2 stands for an image deviation in the x-direction (perpendicular to the scan direction), Z3 represents the image deviation in the y-direction (scan direction) and Z4 represents the defocus.

As mentioned, the mask holding device RST also includes a z-displacement device for the controlled displacement of the reticle or the mask parallel to the z-direction (perpendicular to the scan direction and to the x-direction). This displacement is possible highly dynamically (e.g. on a timescale of tenths of a second to seconds) during a scanning operation, e.g. in order to set field profiles for certain aberrations. Such field profiles often correct reticle heating effects or substrate unevennesses that are otherwise difficult to tackle in the system, e.g. if there is a lack of near-field elements that would be solely able to compensate for such image aberration profiles caused directly in the field with acceptable side effects. During scanning, the reticle heating effects or wafer unevennesses can vary, and readjustment should therefore be carried out dynamically.

A corresponding z-displacement device is provided on the image side at the substrate holding device WST.

Figure 4:
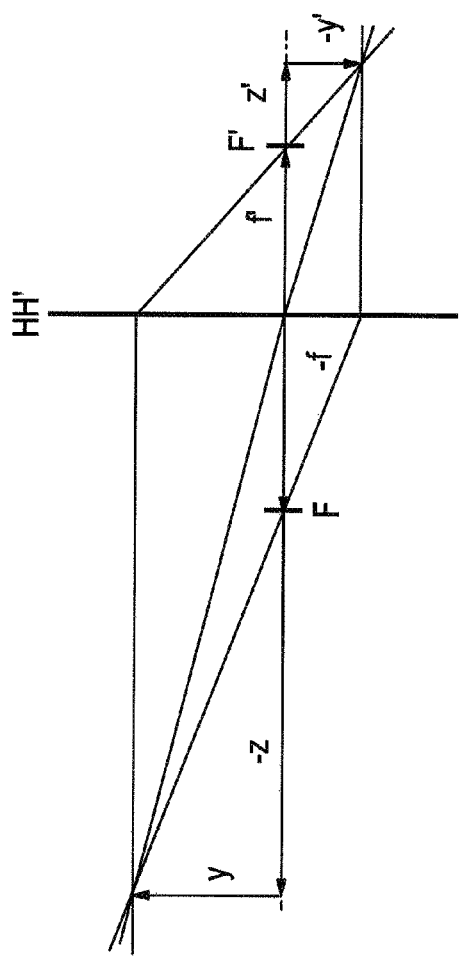
FIG. 4 schematically shows an imaging system.

A problem specific to anamorphic imaging systems is explained below with reference to FIGS. 4 and 5. In this respect, FIG. 4 shows a schematic depiction of an imaging system which is characterized by its principal planes H-H', has an object-side focal length F and an image-side focal length F' and images an object having an object height y into an image having an image height −y'. In this case, the object is situated in the object plane OS, while the image arises in the image plane IS optically conjugate with respect to the object plane. Object-side and image-side distances are measured along the z-direction running parallel to the optical axis of the system shown schematically. The imaging scale β of the imaging system corresponds to the ratio of the absolute value of the image height y' to the absolute value of the object height y in accordance with β=y'/y. Since a reducing imaging is involved, |β|<0 holds true. This imaging scale is present in the y-z-plane of the system shown schematically, the plane coinciding with the plane of the drawing. If the object is then shifted parallel to the z-direction, the question arises as to what extent the image plane shifts in the z-direction or to what extent it is desirable to effect refocusing in the image region in order to obtain a focused imaging again in the event of an object shift in the z-direction. If Δz indicates the extent of the object shift parallel to the z-direction, a displacement of the image plane by Δz' arises in the image region in accordance with the condition:

$$\Delta z' = \beta^2 \Delta z$$

The quotient $\Delta z'/\Delta z$ is designated here as length scale (or depth scale). The longitudinal scale in traditional imaging optical systems is thus given by $\beta^2$, that is to say the square of the imaging scale.

Applied to the imaging of a pattern arranged in the object plane of a projection lens into the image plane of the projection lens, this means that a displacement (change in position) of the reticle bearing the pattern in the z-direction leads to a displacement of the image plane parallel to the z-direction, wherein the extent of the displacement is dependent on the imaging scale.

An anamorphic imaging system is then characterized in that it has an orientation-dependent imaging scale. The imaging scale in the x-direction shall be given here by $\beta_x$, and the imaging scale in the y-direction perpendicular thereto shall be given by $\beta_y$.

Figure 5:
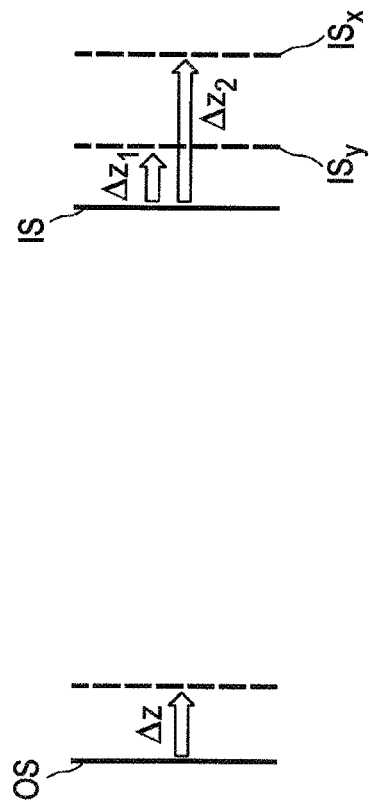
FIG. 5 schematically shows the displacement of image planes that is induced by axial object displacement in the case of an anamorphic imaging system.

In this respect, FIG. 5 shows schematically in the left-hand part, with a solid line, the original position of the pattern or of the reticle in the object plane OS and, with a dashed line, a new position that results after displacement of the reticle by the absolute value Δz in the z-direction. In the right-hand partial figure, the original position of the image plane IS before the displacement is identified with a solid line. The dashed line $IS_y$ shows the new position of the image plane for the y-direction. The latter has shifted by the absolute value $\Delta z_1$ with respect to the original position. The other dashed line $IS_x$ shows the position of the new image plane in the x-direction, which is at a distance $\Delta z_2$ from the original position of the image plane. It is evident that the new image plane in the x-direction and the new image plane in the y-direction no longer coincide when the reticle is shifted, but rather are at a distance from one another in the z-direction. Furthermore, it is evident that the longitudinal scale in the x-direction differs from the longitudinal scale in the y-direction, wherein it holds true that:

$$\Delta z_1 = \beta_y^2 * \Delta z$$

$$\Delta z_2 = \beta_x^2 * \Delta z$$

This is the characteristic of an astigmatic imaging aberration AST, in accordance with:

$$AST = \Delta z_2 - \Delta z_1 = (\beta_x^2 - \beta_y^2) * \Delta z$$

From this, for a given image-side numerical aperture NA of the imaging system, a Zernike coefficient Z5 representing the astigmatism can be derived in accordance with:

$$Z_5 \approx AST \Big/ \left( \frac{4}{NA^2} - 1 \right)$$

In conventional imaging systems having the same imaging scale in x- and y-directions, an imaging aberration that arises as a result of a shift of the reticle in the z-direction could be completely corrected by corresponding displacement of the substrate to be exposed parallel to the z-direction in accordance with the longitudinal scale. Such a correction is not possible in the case of anamorphic imaging systems, however, since the imaging scales in mutually perpendicular planes or directions differ. In exemplary embodiments of projection lenses according to the present disclosure, specific mechanisms are present in order, despite an anamorphic imaging, to be able at least partly to correct the astigmatic aberration portions generated by a z-displacement of the reticle. For this purpose, the projection lens PO is equipped with a dynamic wavefront manipulation system for correcting astigmatic wavefront aberration portions caused by reticle displacement during a scan operation.

Investigations by the inventors have shown that it is possible to compensate for the described, generally undesired and thus harmful effect of the supervening astigmatic aberration by moving the mirrors of the projection lens rapidly (for example on a timescale of tenths of a second) in a controlled manner in their rigid body degrees of freedom. For this purpose, an assigned actuating device DR1 to DR6 (symbolized by double-headed arrows) is provided at each of the mirrors M1 to M6. Each of the actuating devices is connected to the central control unit CU of the projection exposure apparatus for driving purposes. Each of the actuating devices can move the assigned mirror in relation to its reference position predefined by the basic design (e.g. tables 1 and 2), without the respective mirror surface being deformed in the process. A displacement can include e.g. a shift parallel to the reference axis (axis perpendicular to object plane and image plane), a shift perpendicular to the reference axis and/or a tilting (tilting movement).

All the mirrors have non-rotationally symmetrical reflective freeform surfaces. In the case of such forms, if appropriate, a controlled rotation about a rotation axis can also be used for generating an astigmatic change in the wavefront (cf. WO 2012041459 A1). The displacement can thus also include a rotation of at least one of the mirrors about a rotation axis during scanning or be generated exclusively by such a rotation.

The mirrors that are actuation-movable in their rigid body degrees of freedom thereby become components of manipulators of a first type of manipulator, which allows partial or complete compensation of astigmatic wavefront aberration portions that can arise as a result of the displacement of the reticle perpendicular to the object plane.

Furthermore, this first type of manipulator provides a fast correction possibility for the x-y-astigmatism of the projection lens. Such astigmatic aberrations can arise for example as a result of heating effects in the projection lens if dipole illuminations are used for example for imaging dense lines. Some of the mirrors (one or a plurality) can be situated in proximity to a pupil surface in such a way that they feel this non-rotationally symmetrical light distribution as a spatial distribution of incident radiation energy and locally heat up to a greater extent in the illuminated regions than in uniluminated regions and correspondingly deform. This can change the optical path lengths precisely such that astigmatism in x-y-orientation arises. This effect can be partly or completely compensated for by manipulators of the first type of manipulator.

The effect of fast rigid body manipulators can be explained on the basis of a quantitative example. In one example, an EUV projection lens (not illustrated in greater detail here) is operated with a relatively greatly curved ring field RF, which can have e.g. in the image plane parallel to the x-direction a width of 26 mm and perpendicular to the x-direction, i.e. in the scan direction, a height of 1.2 mm. The ring field can be curved to such a great extent that in the image plane a distance—measured in the scan direction (y-direction)—between a middle field point FP1 at the (concavely curved) field edge lagging in the scan direction and marginal field points at the margin of the field edge corresponds to more than 25% of the field width measured perpendicular to the scan direction.

The projection lens shall have an imaging scale $\beta_x=0.25$ (second imaging scale) in the x-direction and an imaging scale $\beta_y=0.125$ (first imaging scale) in the y-direction. For three aberrations Z2, Z3, Z4, there was determined in each case the correction potential for different field profiles in the x-direction for different correction scenarios via simulation. In this case, the abbreviation "Z2_0" stands for the constant portion, Z2_1 stands for the linear portion and Z2_2 stands for the quadratic portion of the profile of the Z2 aberration averaged in the scan direction (distortion in the x-direction).

In a first correction scenario, a z-shift of the reticle was compensated for only by an optimized z-shift and tilts about x- and y-axes of the wafer. Table 4 shows the corresponding residual aberration level. It is evident that Z2_1 and Z2_2 cannot be sufficiently corrected solely by movement of reticle and wafer. This substantially originates from the anamorphic design of the projection lens on which the simulation is based.

With otherwise identical boundary conditions, in a second correction scenario, a fast coordinated rigid body movement of all the mirrors was also permitted in addition to the z-displacement of reticle and wafer. Table 5 shows the corresponding residual aberration levels. It is evident that the critical profiles Z2_1 and Z2_2 and Z3_2 can be well corrected.

TABLE 4

|    | _0   | _1    | _2    |
|----|------|-------|-------|
| Z2 | 0.0% | 77.6% | 82.2% |
| Z3 | 0.0% | 4.4%  | 43.8% |
| Z4 | 2.4% | 2.5%  | 13.7% |

TABLE 5

|    | _0   | _1   | _2    |
|----|------|------|-------|
| Z2 | 0.0% | 0.2% | 5.7%  |
| Z3 | 0.0% | 0.1% | 11.7% |
| Z4 | 0.2% | 2.3% | 14.2% |

A further correction possibility for reducing or compensating for astigmatic wavefront aberration portions as a result of reticle displacement perpendicular to the object plane consists in using one or a plurality of mirrors positioned optically sufficiently close to a pupil surface as manipulators and in astigmatically deforming their mirror surfaces. A second type of manipulator can thereby be provided.

That variant of a wavefront manipulation system which is shown with reference to FIG. 3 uses the sixth mirror M6 arranged relatively near a pupil surface (second pupil surface PF2) as a corresponding manipulator of the second type of manipulator. The mirror has a reversibly deformable mirror surface MS6 arranged in the projection beam path. The subaperture ratio SAR at the mirror surface MS6 satisfies the condition SAR>0.9, as a result of which it is clear that the mirror surface lies optically near the closest pupil surface. An actuating device DR6' assigned to the mirror is designed to generate a reversible astigmatic change of the surface shape of the mirror surface in relation to a reference surface shape. The reference surface shape is that surface shape which results from the optical basic design of the projection lens (see tables 1 and 2, for example). The detailed illustration in FIG. 3 shows the rear side of the sixth mirror M6 with actuators (e.g. piezo-actuators) ACT for astigmatically deforming the mirror surface, the actuators being divided into four quadrants.

Manipulators of the first type of manipulator (movement in rigid body degrees of freedom) and of the second type of manipulator (mirror surface deformation) can be provided alternatively on different embodiments. A combination of different types of manipulator in the same projection lens is also possible as desired.

There are various possibilities for driving the manipulators of the first and/or of the second type of manipulator.

The driving of the actuating devices can be carried out on the basis of a feedforward model. In this variant of the driving, the dynamic displacement/tilting of the reticle during a scan operation is already known before the scan operation. Via previously calculated and tabulated sensitivities, the undesired astigmatic aberrations which are caused by the reticle movement and will occur during the scan operation are also known. In this case, the term "sensitivity" describes the relationship between a defined steep value change at a manipulator and the resultant effect on the imaging quality or on lithographic aberrations.

An optimization algorithm integrated into the control unit CU can then calculate, on the basis of the expected astigmatic aberrations, a corresponding "dynamic correction recipe" (i.e. an optimum travel or actuation distance or an optimum trajectory for each manipulator) in order to dynamically correct the astigmatic aberrations. On the basis of this correction recipe, the actuation devices of the mirrors are driven dynamically during the scan operation such that the astigmatic aberrations is thereby corrected.

As an alternative to a calculation of the optimum trajectories of the manipulators via an integrated optimization algorithm, for any possible movement of the reticle the associated optimum travels of the manipulators can also be calculated beforehand and be present in tabulated form (look-up table) in a memory of the control unit. In this case, it is also possible that the travels of the manipulators are not defined before each scan operation, rather the control unit drives the actuating devices of the manipulators during the scan operation on the basis of the instantaneous position of the reticle with the aid of the tables present. In this case, therefore, the movement of the reticle leads to a quasi-instantaneous movement of the manipulators that is coupled therewith.

In the above embodiments the optical effect of the wavefront manipulation system is changed with dynamics on a relatively short time scale during a scan operation. However, this is not the only situation where manipulations of the wavefront may be useful. For example, in some embodiments the optical effect of the wavefront manipulation system is changed during a time interval which is outside a scan operation. Specifically, the steps of displacing the mask and correcting astigmatic wavefront aberration portions may be performed in a set up phase before a new set of scanning operations is performed. Exemplary scenarios will be described below.

In a first scenario an initial adjustment of the projection objective is considered. It is possible that, during an initial adjustment, the projection objective exhibits magnification errors which could at least partly be corrected by displacing the mask perpendicular to the object plane, i.e. in the z-direction. As explained above, a residual astigmatic aberration may be generated when an anamorphic projection objective is used. In the first scenario a deformable mirror of the wavefront manipulation system will be used to generate a corresponding astigmatic aberration compensating at least partly the astigmatic aberration generated by mask displacement. In order to achieve the correcting effect, a virtual manipulator may be generated, which manipulator may be considered as a virtual manipulator essentially free of astigmatism and which includes the deformable mirror and the displaceable mask.

One step includes loading the sensitivities of the mask and the deformable mirror into an evaluation unit. In the present application, the term "sensitivity" describes the relation between a defined change of a set point of a manipulator and the resulting effect on the imaging quality associated with the change of the set point. A change of set points may, for example, include a change of position of an actuator, i.e. a travel In a next step, profiles for actuating movements are calculated which will be effective to compensate for the astigmatism generated by mask displacement. These preparatory calculations are utilized to provide a virtual manipulator including the deformable mirror and the displaceable mask.

In preparation of a new set of exposures a new mask may be loaded into the mask holding device of the projection exposure apparatus. An aberration measurement will then be performed by an appropriate approach, such as a wavefront measuring system. One or more manipulators will then be loaded including corresponding sensitivities and combination of actuator movements (or travels) for a virtual manipulator including the displaceable mask and the deformable mirror. A model describing the overall behavior of the projection objective including the manipulator is then activated in a following routine. The model may be optimized by modifying the travels of actuators and considering corresponding residual aberrations. Where a subsequent aberration measurement shows aberration values above or a certain threshold value, a new optimization routine with changed parameters will be initiated. The end of the initial adjustment is reached when the aberration measurement shows that either no significant improvements can be obtained by modifying the manipulators and/or the aberration level is within the specification. In another scenario different layers of pattern shall be printed (exposed) one on the other in a multiple exposure procedure. Two different mask types A and B are used for this purpos, where the patterns of each of the mask may have differing magnification errors. Magnification errors may be determined beforehand, for example, by external measurements. Where the projection objective is non-telecentric on the object side, a displacement of the mask in z-direction may be used as a magnification manipulator (to compensate for magnification errors). In order to avoid parasitic astigmatic aberrations in an anamorphic projection lens, a corresponding actuation of a manipulator, such as a deformable mirror, shall be performed.

In the process, mask A may be first used and then unloaded from the mask holding device. In a next step, mask B may be loaded into the mask holding device and corresponding mask data are loaded into the control unit. At an appropriate time, manipulators are loaded into the evaluation unit, including respective sensitivities and combination of set point changes for the virtual manipulator including a displaceable mask and a deformable mirror. A model describing the overall behavior of the projection objective including the manipulator is then activated in a following routine. The model may be optimized by modifying the travels of actuators and considering corresponding residual aberrations.

Once the mask B is positioned in the desired position and the deformable mirror has the desired deformation state, a new exposure may start.

The adjustments applied to the position of a mask and the deformation state of the deformable mirror (and possible other manipulators) need not be as fast as the case of manipulations during a scanning operation. However, a highly dynamic wavefront manipulation system can be used for manipulations performed outside the time intervals where scanning operations are performed.

TABLE 1

| Surface | Radius | Distance value | Operating mode |
|---|---|---|---|
| Image plane | INFINITY | 352.884 | |
| M6 | −889.919 | −802.884 | REFL |
| M5 | −219.761 | 1800.787 | REFL |
| M4 | −999.946 | −434.619 | REFL |
| M3 | −1033.356 | 483.832 | REFL |
| M2 | 2464.083 | −947.116 | REFL |
| M1 | 1323.688 | 1047.116 | REFL |
| Object plane | INFINITY | 0.000 | |

TABLE 2

| Coefficient | M6 | M5 | M4 |
|---|---|---|---|
| K | 3.303831E−03 | 2.041437E−02 | −1.056546E−01 |
| Y | 0.000000E+00 | 0.000000E+00 | 0.000000E+00 |
| X2 | 1.106645E+00 | 4.620513E+00 | 1.065419E+00 |
| Y2 | 1.316656E+00 | 4.632819E+00 | 2.089523E+00 |
| X2Y | −6.987016E−02 | 6.244905E−02 | 2.322141E−01 |
| Y3 | −1.544816E−01 | −2.303277E−01 | −2.158981E−01 |
| X4 | 3.297744E−02 | 9.371547E−02 | 7.579352E−02 |
| X2Y2 | 6.476911E−02 | 1.671737E−01 | 8.744751E−02 |
| Y4 | 5.431530E−02 | 7.743085E−02 | 2.360575E−01 |
| X4Y | −7.040479E−04 | 4.607809E−03 | 3.61681E−03 |
| X2Y3 | −6.159827E−03 | −1.034287E−02 | 9.782459E−03 |
| Y5 | −4.061987E−03 | −3.840440E−03 | −1.297054E−01 |
| X6 | 1.398226E−03 | 3.085471E−03 | 6.847894E−03 |
| X4Y2 | 2.977799E−03 | 8.906352E−03 | 6.372742E−03 |
| X2Y4 | 4.433992E−03 | 8.678073E−03 | −2.569810E−02 |
| Y6 | 1.255594E−03 | 1.683572E−03 | 9.106731E−02 |
| X6Y | 2.969767E−04 | 1.881484E−04 | 1.342374E−03 |
| X4Y3 | −2.820109E−04 | −1.123168E−03 | −5.896992E−03 |
| X2Y5 | −3.654895E−04 | −5.949903E−04 | 1.660704E−03 |
| Y7 | 8.966891E−05 | −3.952323E−04 | −3.764049E−02 |
| Nradius | 2.899772E+02 | 6.300046E+01 | 2.064580E+02 |

| Coefficient | M3 | M2 | M1 |
|---|---|---|---|
| K | 5.744686E−01 | −3.325393E+02 | −1.583030E−02 |
| Y | 0.000000E+00 | 0.000000E+00 | 0.000000E+00 |
| X2 | 3.651408E−01 | 3.277030E−01 | −2.811984E−02 |
| Y2 | 2.123536E+00 | 1.609563E+00 | −4.135835E−01 |
| X2Y | 2.013521E−01 | −6.948142E−01 | −3.866470E−02 |
| Y3 | −1.210907E−02 | 3.694447E−01 | −1.853273E−02 |
| X4 | 5.478320E−02 | 1.369729E−01 | 1.349339E−03 |
| X2Y2 | 7.482002E−02 | 1.984843E−01 | 3.032808E−03 |
| Y4 | 8.327949E−02 | −1.227576E−01 | −2.824781E−03 |
| X4Y | −2.048831E−03 | −4.568931E−02 | −4.300195E−04 |
| X2Y3 | −4.029059E−03 | −1.713508E−02 | −6.501646E−04 |
| Y5 | −1.415756E−02 | 6.185385E−03 | 3.144628E−03 |
| X6 | 1.998416E−04 | −1.834856E−02 | 6.906841E−05 |
| X4Y2 | −1.979383E−03 | −3.309794E−02 | 5.274081E−05 |

TABLE 2-continued

| X2Y4 | −5.943296E−03 | −5.169942E−02 | −1.330272E−03 |
| Y6 | 1.246118E−03 | −1.603819E−01 | −1.363317E−02 |
| X6Y | 1.584327E−04 | 7.876367E−03 | −2.377257E−05 |
| X4Y3 | −3.187207E−04 | −1.244804E−02 | −2.251271E−04 |
| X2Y6 | −5.566601E−04 | −5.748055E−02 | −0.006573E−04 |
| Y7 | −1.399787E−03 | −3.870909E−02 | 4.001012E−03 |
| Nradius | 8.132829E+01 | 7.472082E+01 | 1.311311E+02 |

TABLE 3

| Coefficient | M6 | M5 | M4 | M3 | M2 | M1 | Image plane |
|---|---|---|---|---|---|---|---|
| Y-decenter | −51.252 | −99.408 | 123.654 | 215.631 | 528.818 | 512.855 | 0.000 |
| X-rotation | 0.323 | 7.067 | −2.444 | 10.483 | 16.940 | 3.488 | 0.000 |

What is claimed is:

1. A projection lens configured to image a pattern of a reticle in an object plane of the projection lens into an image plane of the projection lens via radiation having an EUV operating wavelength, the projection lens comprising:
a multiplicity of mirrors, each mirror having a surface in a projection beam path between the object plane and the image plane so that the pattern of the reticle in the object plane is imagable into the image plane via the mirrors; and
a dynamic wavefront manipulation system configured to correct astigmatic wavefront aberration portions caused by reticle displacement in a direction perpendicular to the object plane,
wherein:
a first imaging scale in a first direction parallel to a scan direction is smaller in terms of absolute value than a second imaging scale in a second direction perpendicular to the first direction;
the wavefront manipulation system is configured so that astigmatic wavefront aberration portions caused by reticle displacement are correctable during a scan operation;
the wavefront manipulation system comprises a first manipulator and a first actuating device;
the plurality of mirrors comprises a displaceable mirror; and
the first actuating device is configured to reversibly change a position of the displaceable mirror relative to a reference position.

2. The projection lens of claim 1, wherein reversible changing the position of the displaceable mirror comprises at least one displacement selected from the group consisting of:
an axial displacement of the displaceable mirror parallel to a reference axis directed orthogonally to the object plane;
a lateral displacement of the displaceable mirror in a lateral direction perpendicular to a reference axis directed orthogonally to the object plane;
a tilting of the displaceable mirror; and
a rotation about a rotation axis of a reflective freeform surface of the displaceable mirror.

3. The projection lens of claim 2, wherein the first manipulator is configured so that, during use of the projection lens, the position of the displaceable mirror is changed in a time interval between the beginning and end of a scan operation running in one direction according to a predefinable movement profile from a starting position via at least one intermediate position back to the starting position.

4. The projection lens of claim 3, wherein the first manipulator is configured so that, during use of the projection lens, the position of the displaceable mirror is changed in less than one second.

5. The projection lens of claim 4, each of the plurality of mirrors has an actuating device configured to reversibly change a position of the mirror in relation to a reference position to correct astigmatic wavefront aberration portions caused by reticle displacement in direction perpendicular to the object plane.

6. The projection lens of claim 5, wherein:
the wavefront manipulation system comprises a second manipulator and a second actuating device;
the plurality of mirrors comprises a deformable mirror; and
the second actuating device is configured to reversibly astigmatically change a shape of the surface of the deformable mirror relative to a reference surface shape.

7. The projection lens of claim 6, wherein:
the projection lens has a pupil surface between the object plane and the image plane;
the deformable mirror is arranged optically in proximity to the pupil surface so that the astigmatically changeable mirror surface of the deformable mirror is arranged at a subaperture ratio that is between 0.5 and 1.

8. The projection lens of claim 7, wherein the first and second manipulators are configured so that an actuating movement relevant to the change of the optical effect of the mirror is generatable within less than one second.

9. The projection lens of claim 8, wherein a ratio of the second imaging to the first imaging scale is in the range of 1.1 to 2.5.

10. The projection lens of claim 1, wherein a front focal length of the projection lens in the second direction has an absolute value of less than three meters.

11. The projection lens of claim 10, wherein the projection lens is configured to image a ring field that is curved in the scan direction.

12. The projection lens of claim 11, wherein a curvature of the ring field is configured so that in the image plane a distance measured in the scan direction between a middle field point at a field edge lagging in the scan direction and marginal field points at the margin of the field edge is more than 5% of the field width measured perpendicular to the scan direction.

13. An apparatus, comprising:
an illumination system; and
a projection lens according to claim 1,
wherein the illumination system is configured to illuminate a reticle in the object field of the projection lens, and the apparatus is a projection exposure apparatus.

14. The apparatus of claim 13, further comprising a reticle holding device comprising a displacement device to control displacement of the reticle parallel to a direction running orthogonally to the object plane.

15. The apparatus of claim 14, wherein the displacement device is configured to displace the reticle in a time interval between beginning and end of a scan operation running in one direction according to a predefinable movement profile.

16. A method of using a projection exposure apparatus comprising an illumination optical assembly and a projection optical assembly, the method comprising:
using the illumination optical assembly to illuminate at least one section of a reticle with radiation; and
using the projection optical assembly to project an image of the at least one section of the reticle onto a material that is sensitive to the radiation,
wherein the projection lens is a projection lens according to claim 1.

17. A method, comprising:
providing a reticle between an illumination system and an anamorphic projection lens of a projection exposure apparatus so that a pattern of the reticle is in a region of an object plane of the projection lens and is imagable via the projection lens into an image plane of the projection lens, the image plane being optically conjugate tospect to the object plane;
illuminating an illumination region of the pattern of the reticle with an illumination radiation provided by the illumination system;
moving the reticle in a scan direction during a scan operation;
displacing the reticle in a displacement direction perpendicular to the object plane; and
correcting astigmatic wavefront aberration portions caused by the displacement of the reticle via a dynamic wavefront manipulation system.

18. The method of claim 17, wherein displacing the reticle and correcting astigmatic wavefront aberration portions are performed during the scan operation.

19. A method, comprising:
providing a reticle between an illumination system and an anamorphic projection lens of a projection exposure apparatus so that a pattern of the reticle is in a region of the object plane of the projection lens;
positioning a substrate so that a radiation-sensitive surface of the substrate is in a region of an image plane of the projection lens, the image plane being optically conjugate to the object plane;
illuminating an illumination region of the reticle with an illumination radiation provided by the illumination system;
projecting a part of the pattern that lies in the illumination region onto an image field at the substrate with the aid of the projection lens;
moving the reticle in a scan direction during a scan operation;
displacing the reticle in a displacement direction perpendicular to the object plane during the scan operation; and
astigmatically influencing the wavefront of the projection radiation passing from the object plane to the image plane by driving at least one manipulator having a manipulable mirror arranged in the projection beam path and an actuating device for reversibly changing the optical effect of the manipulable mirror,
wherein:
the projection lens comprises:
a multiplicity of mirrors, each mirror having a surface in a projection beam path between the object plane and the image plane so that the pattern of the reticle in the object plane is imagable into the image plane via the mirrors; and
a dynamic wavefront manipulation system configured to correct astigmatic wavefront aberration portions caused by reticle displacement in a direction perpendicular to the object plane;
a first imaging scale in a first direction parallel to a scan direction is smaller in terms of absolute value than a second imaging scale in a second direction perpendicular to the first direction;

an actuating movement of the manipulator that is relevant to the change of the optical effect of the manipulable mirror is carried out within a short timescale of less than one second:

the method further comprises driving actuating devices of manipulators of the wavefront manipulation system depending on a dynamic displacement and/or tilting of a mask; and the driving is carried out on the basis of a feedforward model using previously calculated sensitivities or on the basis of a previously calculated look-up table.

20. A method, comprising:

providing a reticle between an illumination system and an anamorphic projection lens of a projection exposure apparatus so that a pattern of the reticle is in a region of the object plane of the projection lens;

positioning a substrate so that a radiation-sensitive surface of the substrate is in a region of an image plane of the projection lens, the image plane being optically conjugate to the object plane;

illuminating an illumination region of the reticle with an illumination radiation provided by the illumination system;

projecting a part of the pattern that lies in the illumination region onto an image field at the substrate with the aid of the projection lens;

moving the reticle in a scan direction during a scan operation;

displacing the reticle in a displacement direction perpendicular to the object plane during the scan operation; and astigmatically influencing the wavefront of the projection radiation passing from the object plane to the image plane by driving at least one manipulator having a manipulable mirror arranged in the projection beam path and an actuating device for reversibly changing the optical effect of the manipulable mirror.

21. The method of claim 20, wherein:

the projection lens comprises:

a multiplicity of mirrors, each mirror having a surface in a projection beam path between the object plane and the image plane so that the pattern of the reticle in the object plane is imagable into the image plane via the mirrors; and a dynamic wavefront manipulation system configured to correct astigmatic wavefront aberration portions caused by reticle displacement in a direction perpendicular to the object plane; and a first imaging scale in a first direction parallel to a scan direction is smaller in terms of absolute value than a second imaging scale in a second direction perpendicular to the first direction.

22. The method of claim 21, wherein an actuating movement of the manipulator that is relevant to the change of the optical effect of the manipulable mirror is carried out within a short timescale of less than one second.

* * * * *

UNITED STATES PATENT AND TRADEMARK OFFICE
CERTIFICATE OF CORRECTION

| | |
|---|---|
| PATENT NO. | : 10,048,592 B2 |
| APPLICATION NO. | : 15/441441 |
| DATED | : August 14, 2018 |
| INVENTOR(S) | : Stephan Andre et al. |

It is certified that error appears in the above-identified patent and that said Letters Patent is hereby corrected as shown below:

In the Specification

Column 13, Line 65, delete "apparatuss" and insert -- apparatus --.

Column 14, Line 17, delete "y'''" and insert -- y''. --.

Column 20, Line 16, delete "travel" and insert -- travel. --.

Column 20, Line 44, delete "purpos," and insert -- purpose, --.

In the Claims

Column 25, Claim 19, Line 4, delete "second:" and insert -- second; --.

Signed and Sealed this
Ninth Day of April, 2019

Andrei Iancu
*Director of the United States Patent and Trademark Office*